United States Patent
Hu et al.

(10) Patent No.: US 9,236,346 B2
(45) Date of Patent: *Jan. 12, 2016

(54) 3-D IC DEVICE WITH ENHANCED CONTACT AREA

(71) Applicant: Macronix International Co., Ltd., Hsinchu (TW)

(72) Inventors: Chih-Wei Hu, Toufen Township (TW); Teng-Hao Yeh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/617,420

(22) Filed: Feb. 9, 2015

(65) Prior Publication Data
US 2015/0179575 A1    Jun. 25, 2015

Related U.S. Application Data

(63) Continuation of application No. 13/948,508, filed on Jul. 23, 2013, now Pat. No. 8,981,567.

(60) Provisional application No. 61/778,562, filed on Mar. 13, 2013.

(51) Int. Cl.
*H01L 23/535* (2006.01)
*H01L 21/768* (2006.01)
*H01L 27/115* (2006.01)
(Continued)

(52) U.S. Cl.
CPC ............ *H01L 23/535* (2013.01); *H01L 21/768* (2013.01); *H01L 21/76838* (2013.01); *H01L 21/76883* (2013.01); *H01L 27/11548* (2013.01); *H01L 27/11575* (2013.01); *H01L 27/11582* (2013.01); *H01L 23/485* (2013.01);
(Continued)

(58) Field of Classification Search
CPC ... H01L 29/788; H01L 23/522; H01L 23/485; H01L 29/41766
See application file for complete search history.

(56) References Cited

U.S. PATENT DOCUMENTS 8,237,211 B2    8/2012    Fukuzumi et al.
8,981,567 B2    3/2015    Hu et al.
(Continued)

OTHER PUBLICATIONS

Kim, Jiyoung et al; Novel 3-D Structure for Ultra High Density Flash Memory with VRAT (Vertical-Recess-Array-Transistor) and PIPE (Planarized Integrationon the same PlanE); 2008 Symposium on VLSI Technology Digest of Technical Papers; pp. 122-123. (cited in parent).

*Primary Examiner* — Peniel M Gumedzoe
(74) *Attorney, Agent, or Firm* — Haynes Beffel & Wolfeld LLP

(57) ABSTRACT

A device includes a substrate with a recess, having a bottom and sides, extending into the substrate from the substrate's upper surface. The sides include first and second sides oriented transversely to one another. A stack of alternating active and insulating layers overlie the substrate's surface and the recess. At least some of the active layers have an upper and lower portions extending along upper and lower planes over and generally parallel to the upper surface and to the bottom, respectively. The active layers have first and second upward extensions positioned along the first and second sides to extend from the lower portions of their respective active layers. Conductive strips adjoin the second upward extensions of the said active layers. The conductive strips can comprise sidewall spacers on the sides of the second upward extensions, the conductive strips connected to overlying conductors by interlayer conductors.

22 Claims, 11 Drawing Sheets

(51) Int. Cl.
*H01L 23/522* (2006.01)
*H01L 29/417* (2006.01)
*H01L 29/788* (2006.01)
*H01L 23/485* (2006.01)

(52) U.S. Cl.
CPC ........ *H01L 23/522* (2013.01); *H01L 27/11556* (2013.01); *H01L 29/41766* (2013.01); *H01L 29/788* (2013.01); *H01L 2924/0002* (2013.01)

(56) References Cited

U.S. PATENT DOCUMENTS

| | | |
|---|---|---|
| 2008/0099819 A1 | 5/2008 | Kito et al. |
| 2008/0253183 A1 | 10/2008 | Mizukami et al. |
| 2009/0001419 A1 | 1/2009 | Han et al. |
| 2010/0254191 A1 | 10/2010 | Son et al. |
| 2012/0182806 A1 | 7/2012 | Chen et al. |
| 2012/0182808 A1 | 7/2012 | Lue et al. |

# 3-D IC DEVICE WITH ENHANCED CONTACT AREA

CROSS-REFERENCE TO RELATED APPLICATIONS

This application is a continuation of U.S. patent application Ser. No. 13/948,508, filed 23Jul. 2013, now U.S. Pat. No. 8,981,567 which application claims benefit of U.S. Provisional Patent Application No. 61/778,562, filed 13 Mar. 2013.

BACKGROUND

1. Field of the Invention

The present invention relates to three-dimensional integrated circuit (3-D IC) devices of the type including at least one array area and an associated contact area, and in particular to providing enhanced electrical contact at the contact area between interlayer conductors, such as bit line plugs, and increasingly thin semiconductor or conductor active layers in a stack of alternating active and insulating layers.

2. Description of Related Art

High density memory devices are being designed that comprise arrays of flash memory cells, or other types of memory cells. In some examples, the memory cells comprise thin film transistors which can be arranged in 3D architectures.

In one example, a 3D memory device includes a plurality of stacks of NAND strings of memory cells. The stacks include semiconductor strips, also referred to as active layers, separated by insulating layers. The 3D memory device includes an array including a plurality of word lines structures, a plurality of string select structures, and ground select lines, arranged orthogonally over the plurality of stacks. Memory cells including charge storage structures are formed at cross-points between side surfaces of the semiconductor strips in the plurality of stacks and the word line structures.

SUMMARY

A device includes a substrate having an upper surface and a recess extending into the substrate from the upper surface. The recess has a bottom and sides extending between the upper surface and the bottom. The sides include first and second sides oriented transversely to one another. A stack of alternating active and insulating layers overlie the upper surface of the substrate and the recess. At least some of the active layers have an upper portion extending along an upper plane over and generally parallel to the upper surface and a lower portion extending along a lower plane over and generally parallel to the bottom. Each of the active layers has first and second upward extensions positioned along the first and second sides to extend from the lower portions of their respective active layers. Conductive strips adjoin the second upward extensions of the said active layers.

Some examples of the device can include one or more the following. The conductive strips can comprise sidewall spacers on sides of the second upward extensions. The second side can be oriented generally perpendicular to the upper surface with the first side being a downwardly and inwardly sloped side oriented at an acute angle to the upper surface. The conductive strips can have lower and upper ends, the lower ends being in the recess and extending to different depths in the recess, the upper ends being configured to connect to overlying conductors by interlayer conductors. The upper ends of the conductive strips can be at the same level, the same level being parallel to the upper surface, or at different levels relative to the upper surface. The upper ends of the conductive strips, or both the upper end of the conductive strips and adjacent ones of the second upward extensions, can provide landing areas for the interlayer conductors.

A method for forming electrical connections with the active layers of a stack of alternating active and insulating layers of a device can be carried out as follows. A recess can be formed through the upper surface of in a substrate, the recess having a bottom and sides extending between the upper surface and the bottom, the sides comprising first and second sides oriented transversely to one another. A stack of alternating active and insulating layers are formed over the upper surface of the substrate and the recess in the following manner. The upper portion of each of a plurality of the active layers is formed to be along an upper plane and over and generally parallel to the upper surface. A lower portion of each of the plurality of active layers is formed to be along a lower plane and over and generally parallel to the bottom. First and second upward extensions of each of the plurality of active layers are positioned along the first and second sides and to extend from the lower portions of their respective active layers. Conductive strips, adjoining the second upward extensions of the plurality of active layers, are formed during the stack forming step.

Some examples of the method can include one or more the following. The recess forming step can include forming the first side as a downwardly and inwardly sloped first side oriented at an acute angle to the upper surface. The conductive strips forming step can be carried out forming the conductive strips as sidewall spacers on sides of the second upward extensions but not on sides of the first upward extensions. The recess forming step can include forming a generally rectangular recess having first, second, third and fourth sides with the first and third sides being opposite one another and being downwardly and inwardly sloped sides oriented at acute angles to the upper surface; and the conductive strips can be formed as sidewall spacers at the second and fourth sides but not at the first or third sides. Interlayer conductors can be formed to contact upper surfaces of the conductive strips, the upper surfaces defining landing areas for the interlayer conductors. The landing areas can extend along a landing area plane generally parallel to the upper surface or at an acute angle to the upper surface. The landing areas can be created by the upper ends of the conductive strips and adjacent ones of the second upward extensions.

Other aspects and advantages of the present invention can be seen on review of the drawings, the detailed description and the claims, which follow.

BRIEF DESCRIPTION OF THE DRAWINGS

FIG. 3 is a top plan view of a substrate including array areas on either side of a recessed contact area, with FIGS. 3A and 3B taken along lines 3A-3A and 3B-3B of FIG. 3.

FIGS. 4-4B show the structure of FIGS. 3-3B after the formation of tapered spacers along the first sides of a recess in the contact area.

FIGS. 5-5B show the structure of FIGS. 4-4B after the conformal deposition of an insulating layer followed by a relatively thick conductive material.

FIGS. 6-6B illustrate the structure of FIGS. 5-5B after an anisotropic etch of the conductive material removing the conductive material from all surfaces except the generally vertical second sides, with the subsequent deposition of an active layer indicated by dashed lines in FIGS. 6A and 6B.

FIGS. 7-7D show the structure of FIGS. 6-6B following the repeat of the deposition and etching steps of FIGS. 5-6B to create a stack of alternating active and insulating layers overlying the array area and the contact area.

FIG. 8 is a simplified top plan view of two side-by-side structures of FIG. 7 but showing bit lines and source lines in the array areas created by additional processing steps.

FIG. 9 shows the structure of FIG. 8 after creating word lines over the bit lines within the array areas.

FIG. 10 is an enlarged view of the contact area of FIG. 9 showing the plan view locations of interlayer conductors shown in FIG. 11.

FIG. 11 is a cross-sectional view of a portion of the structure of FIG. 10 showing interlayer conductors passing through insulating spacers and contacting landing areas created by conductive strips and adjacent first upper extensions of the conductive layers.

FIGS. 12-15 illustrate an alternative to the example shown in FIGS. 10-11 as to how interlayer conductors are connected to landing areas.

FIG. 12 is an enlarged view of the contact area of FIG. 9 but outlining a region to be etched in dashed lines.

FIG. 13 shows the structure of FIG. 12 after etching the region indicated in FIG. 12 so that all of the landing areas lie in a single plane.

FIG. 14 shows the structure of FIG. 13 but indicating where the interlayer conductors shown in FIG. 15 will be created.

FIG. 15 shows the structure of FIGS. 13 and 14 after depositing an insulating material within the etched out region and forming interlayer conductors through the insulating material down to the landing areas.

DETAILED DESCRIPTION

Figure 1:
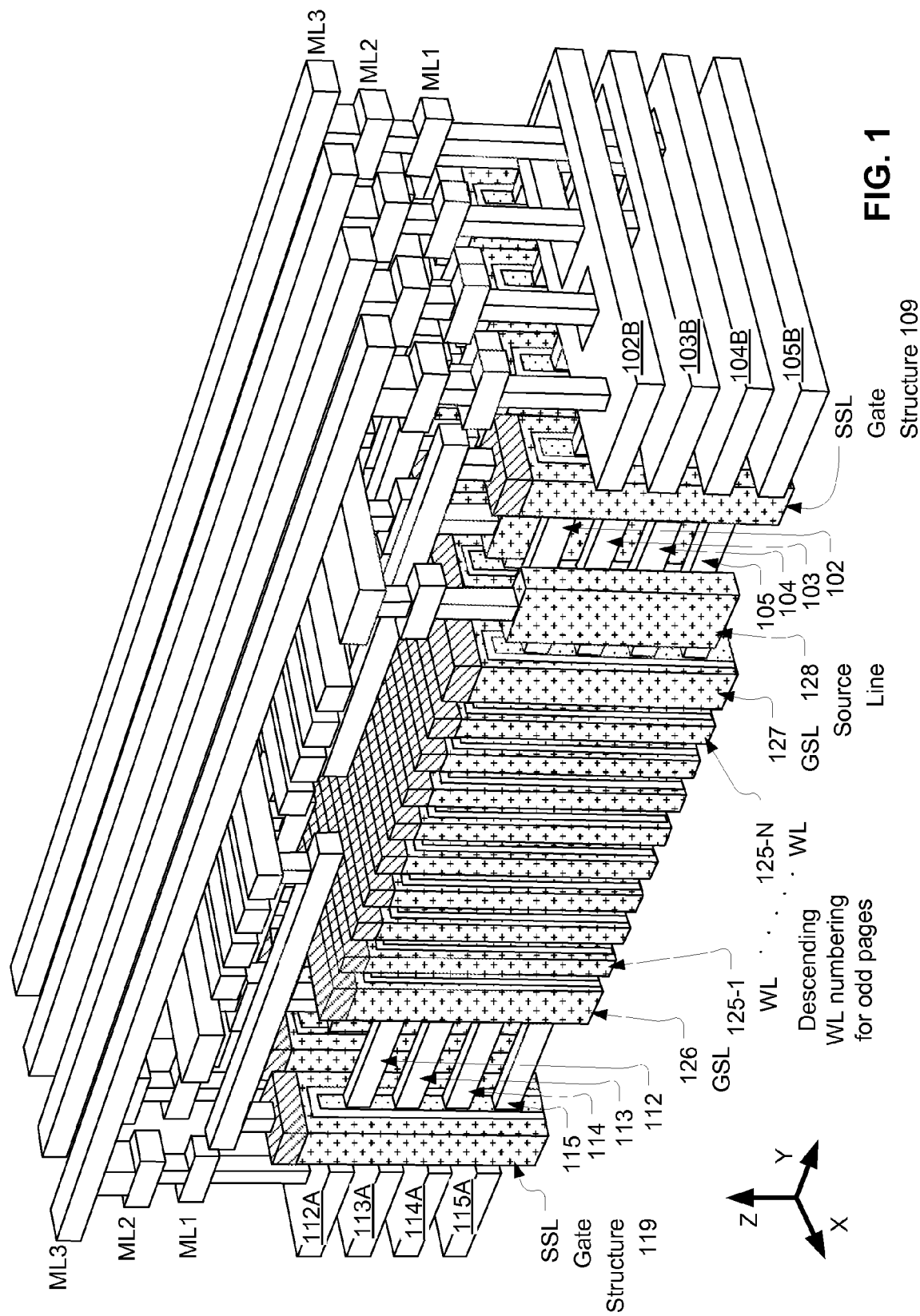
FIG. 1 is a perspective illustration of a 3D NAND memory array structure. Insulating material is removed from the drawing to expose additional structure for illustrative purposes.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals. Also, unless otherwise specified, the terms insulators and conductors refer to electrical insulators and electrical conductors.

FIG. 1 is a perspective illustration of a 3D NAND memory array structure. Insulating material is removed from the drawing to expose additional structure for illustrative purposes. For example, insulating layers are removed between the semiconductor strips (e.g. 112-115) in stacks, and are removed between the stacks of semiconductor strips.

The multilayer array is formed on an insulating layer, and includes a plurality of word lines 125-1 WL, . . . , 125-N WL conformal with the plurality of stacks. The plurality of stacks includes semiconductor strips 112, 113, 114, 115. Semiconductor strips in the same plane are electrically coupled together by stairstep structures, also referred to as bit line structures.

The shown word line numbering, ascending from 1 to N going from the back to the front of the overall structure, applies to even memory pages. For odd memory pages, the word line numbering descends from N to 1 going from the back to the front of the overall structure.

Stairstep structures 112A, 113A, 114A, 115A terminate semiconductor strips, such as semiconductor strips 112, 113, 114, 115, in each active layer of the structure. As illustrated, these stairstep structures 112A, 113A, 114A, 115A are electrically connected to different bit lines for connection to decoding circuitry to select planes within the array. These stairstep structures 112A, 113A, 114A, 115A can be patterned at the same time that the plurality of stacks are defined.

Stairstep structures 102B, 103B, 104B, 105B terminate semiconductor strips, such as semiconductor strips 102, 103, 104, 105. As illustrated, these stairstep structures 102B, 103B, 104B, 105B are electrically connected to different bit lines for connection to decoding circuitry to select planes within the array. These stairstep structures 102B, 103B, 104B, 105B can be patterned at the same time that the plurality of stacks are defined.

Any given stack of semiconductor strips is coupled to either the stairstep structures 112A, 113A, 114A, 115A, or the stairstep structures 102B, 103B, 104B, 105B, but not both. A stack of semiconductor strips has one of the two opposite orientations of bit line end-to-source line end orientation, or source line end-to-bit line end orientation. For example, the stack of semiconductor strips 112, 113, 114, 115 has bit line end-to-source line end orientation; and the stack of semiconductor strips 102, 103, 104, 105 has source line end-to-bit line end orientation. In an alternative, all the strips in one active layer of the block can terminate in the same staircase structure.

The stack of semiconductor strips 112, 113, 114, 115 is terminated at one end by the stairstep structures 112A, 113A, 114A, 115A, passes through SSL gate structure 119, ground select line GSL 126, word lines 125-1 WL through 125-N WL, ground select line GSL 127, and terminated at the other end by source line 128. The stack of semiconductor strips 112, 113, 114, 115 does not reach the stairstep structures 102B, 103B, 104B, 105B.

The stack of semiconductor strips 102, 103, 104, 105 is terminated at one end by the stairstep structures 102B, 103B, 104B, 105B, passes through SSL gate structure 109, ground select line GSL 127, word lines 125-N WL through 125-1 WL, ground select line GSL 126, and terminated at the other end by a source line (obscured by other parts of figure). The stack of semiconductor strips 102, 103, 104, 105 does not reach the stairstep structures 112A, 113A, 114A, 115A.

A layer of memory material separates the word lines 125-1 WL through 125-N WL, from the semiconductor strips 112-115 and 102-105. Ground select lines GSL 126 and GSL 127 are conformal with the plurality of stacks, similar to the word lines.

Every stack of semiconductor strips is terminated at one end by stairstep structures, and at the other end by a source line. For example, the stack of semiconductor strips 112, 113, 114, 115 is terminated at one end by stairstep structures 112A, 113A, 114A, 115A, and terminated on the other end by source line 128. At the near end of the FIG., every other stack of semiconductor strips is terminated by the stairstep structures 102B, 103B, 104B, 105B; and every other stack of semiconductor strips is terminated by a separate source line. At the far end of the figure, every other stack of semiconductor strips is terminated by the stairstep structures 112A, 113A, 114A, 115A; and every other stack of semiconductor strips is terminated by a separate source line.

Bit lines and string select lines are formed in patterned conductor layers, such as the metal layers ML1, ML2, and ML3.

Transistors are formed at cross points between the semiconductor strips (e.g. 112-115) and the word line 125-1 WL through 125-N WL. In the transistors, the semiconductor strip (e.g. 113) acts as the channel region of the device. The semiconductor strips (e.g. 112-115) can act as the gate dielectric for the transistors.

String select structures (e.g. 119, 109) are patterned during the same step that the word lines 125-1 WL through 125-N WL are defined. Transistors are formed at cross points between the semiconductor strips (e.g. 112-115) and the string select structures (e.g. 119, 109). These transistors act as string select switches coupled to decoding circuitry for selecting particular stacks in the array.

In an alternative, the active layer is patterned with word lines and the channels can be vertical between the stacks. See, for example, commonly owned U.S. Patent Application Publication No. 2012/0182808, filed 19 Jan. 2011, entitled Memory Device, Manufacturing Method And Operating Method Of The Same, by inventors Hang-Ting Lue and Shi-Hung Chen, which is incorporated by reference as if fully set forth herein.

The 3D memory device shown in FIG. 1 uses finger VG (vertical gates), like commonly owned U.S. Patent Publication No. 2012/0182806, filed Apr. 1, 2011, entitled Memory Architecture of 3D Array With Alternating Memory String Orientation and String Select Structures by inventors Shih-Hung Chen and Hang-Ting Lue. The vertical gate (VG) structure and other 3D structures can be made using very thin film active layers, such as 1 to 10 nanometers thick, may be a solution to help solve some of the problems. However, using such a thin film active layer can create challenges in the connection of the interlayer conductors to the landing areas. Problems associated with making contact to very thin film active layers will be discussed with reference to FIGS. 2 and 2A.

Figure 2:
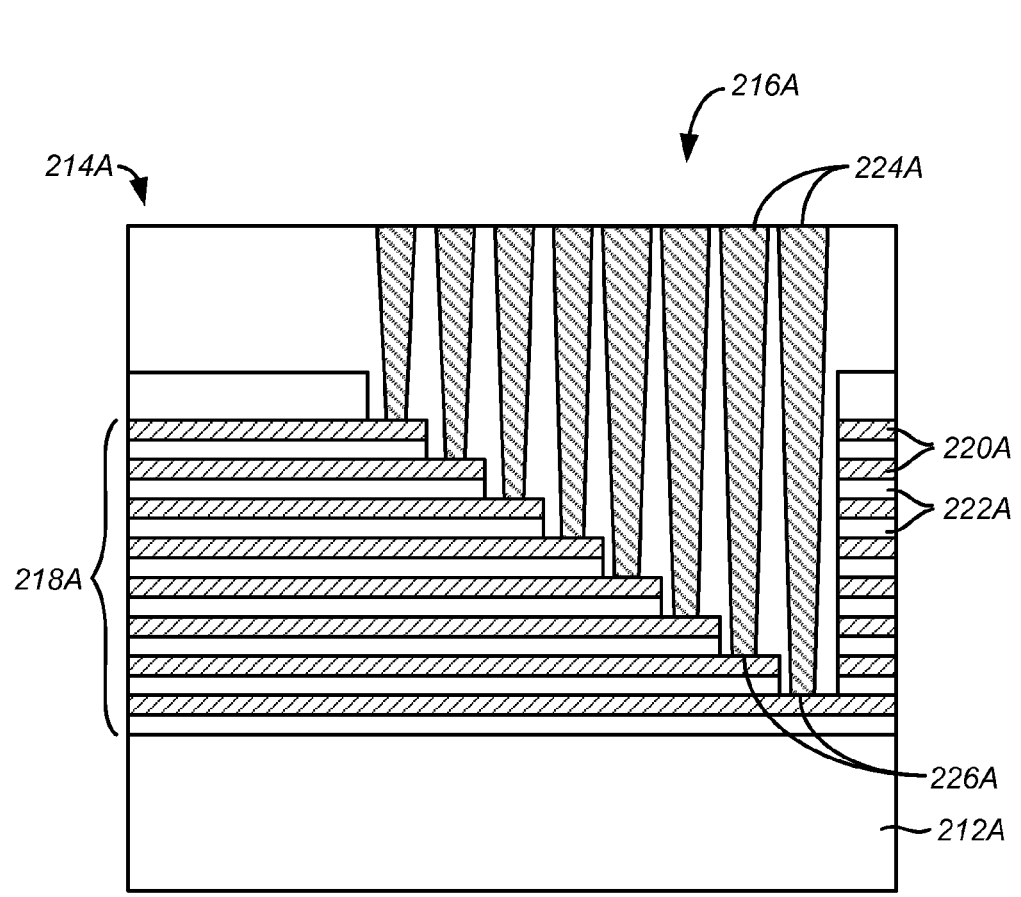
FIG. 2 is a simplified cross-sectional view of a portion of an example of an IC device showing interlayer conductors contacting landing areas at a contact area.
Figure 2A:
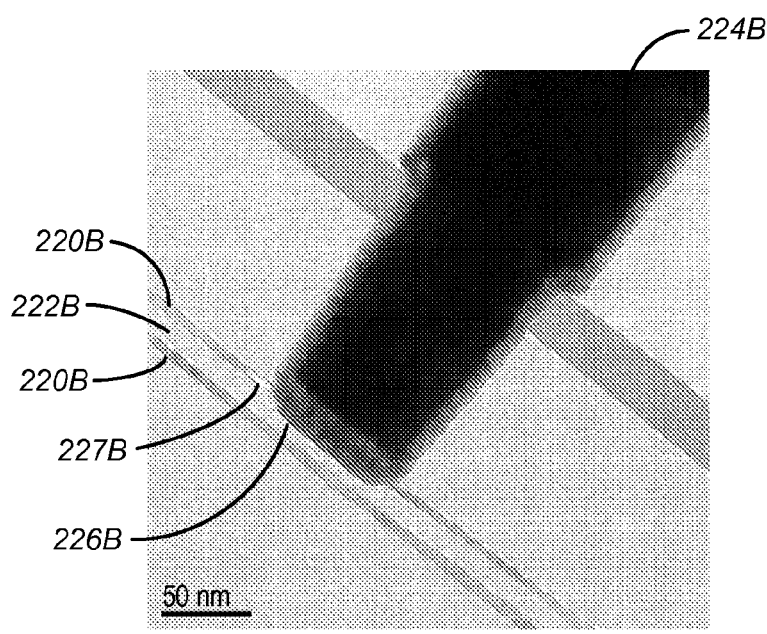
FIG. 2A is an image showing an example of how an interlayer conductor can pass completely through an active layer with which is to be in electrical contact.

FIG. 2 is a simplified cross-sectional view of a portion of an IC device 210A including a substrate 212A, the substrate including an array area 214A and a contact area 216A. A stack 218A of alternating active layers 220A and insulating layers 222A overlie the array area and the contact area. Interlayer conductors 224A extend to the landing areas 226A of the active layers 220A. FIG. 2A is an image showing how, due to the thinness of active layers 220B, an interlayer conductor 224B can be formed so that it passes completely through an active layer 220B; doing so can make the step critical in manufacturing and might limit the contact area to the periphery of interlayer conductor 224B. For perspective on the relative sizes of the interlayer conductors 224B and active layers 220B, the line at the lower left-hand corner of FIG. 2A is 50 nm long. In addition to passing through active layer 220B, use of thin film active layers 220B must deal with a problem caused by the consumption of silicon during the silicide formation following formation of interlayer conductors 224B. This problem is illustrated at position 227B, which shows up as a lighter area, indicating consumption of silicon within active layer 220B. This creates another way that the contact area between active layer 220B and interlayer conductor 224B might be reduced. In one example, when the tungsten in the interlayer conductor 224B contacts the silicon in active layer 220B, a reaction can cause formation of tungsten silicide ($WSi_x$). Silicon to fuel the reaction can be drawn into the via and out of the thin film of active layer 220B creating a void.

FIGS. 3-13 illustrate one example of process steps used for the connection of interlayer conductors 224 to the landing areas 226 at the contact area 216.

Figure 3:
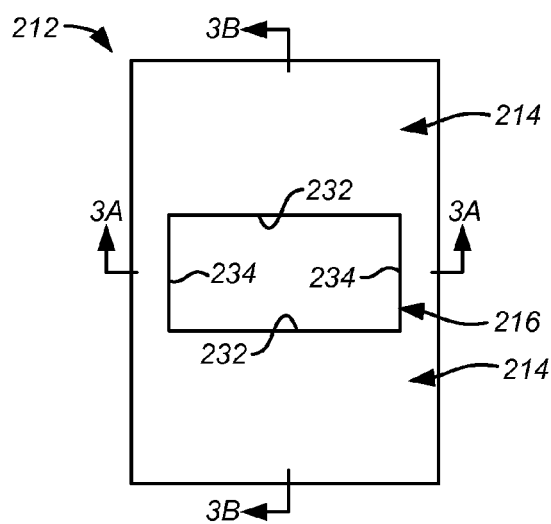
FIGS. 3-13 illustrate one example of process steps in the connection of interlayer conductors to landing areas at the contact area.
Figure 3B:
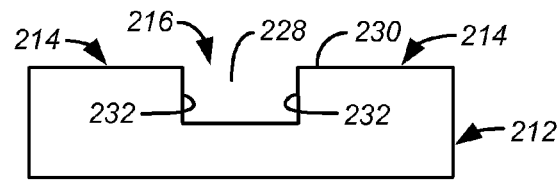
Figure 3A:
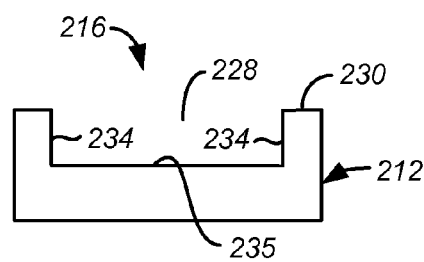

FIG. 3 is a top plan view of a substrate 212 including first and second array areas 214 on either side of a recessed contact area 216. Contact area 216 is formed by a recess 228 extending into substrate 212 from an upper surface 230 of the substrate. FIGS. 3A and 3B are taken along line 3A-3A of FIG. 3 to show first sides 232, and along line 3B-3B of FIG. 3 to show second sides 234, and to illustrate recess 228. Recess 228 is defined on two sides by first sides 232, by second sides 234 connecting the first sides, and by bottom 235.

Figure 4:
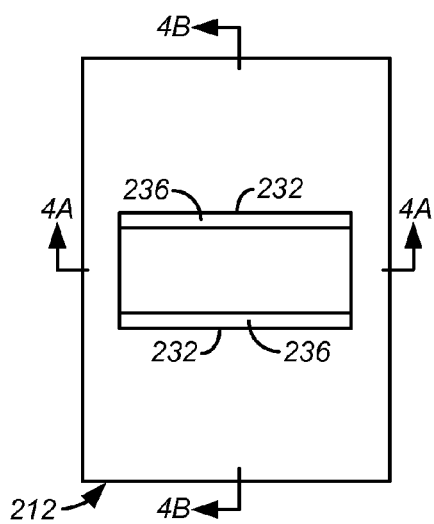
Figure 4B:
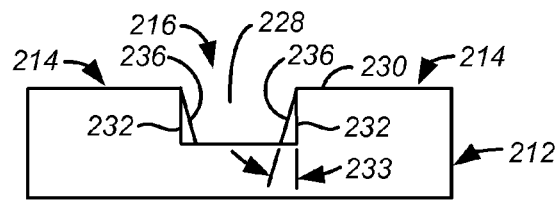
Figure 4A:
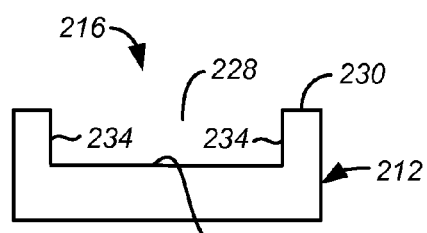

FIGS. 4-4B show the structures of FIGS. 3-3B after the formation of a tapered spacer 236 along the first sides 232 so that recess 228 is defined by generally vertical second sides 234 and sloped first sides 232 created by tapered spacers 236. The surface of tapered spacer 236 slopes downwardly an angle 233 to the vertical. The choice of the material for tapered spacers 236 is determined in part by the desired process for forming tapered spacers 236. In one example, tapered spacers are polysilicon but other materials, such as other semiconductors or metals, can also be used. The sloped profile can be made using various techniques. One technique uses lithography to make the sloped profile. Starting with the trench like recess 228 of FIGS. 3A and 3B with its vertical sides, a photoresist is applied to most of array area 214 to protect the second sides 234 while exposing first sides 232. This is followed by an anisotropic etch, or etch with some ion bombardment, to form the sloped profile on the first sides 232. In this technique, it may not be necessary to create tapered spacers 236. Another technique uses an etching process. An etch stop layer, such as a nitride layer, is deposited on the bottom 235 of the trench like recess 228. After the etch stop layer deposition, a material, such as polysilicon, is deposited within recess 228. Most of the material within recess 228 is removed leaving a tapered spacer layer, similar to tapered spacer 236, along all four sides 232, 234 defining recess 228. Using a photoresist mask and suitable etching steps, the tapered spacer layers along second sides 234 are removed leaving tapered spacers 236 only along first sides 232.

Figure 5:
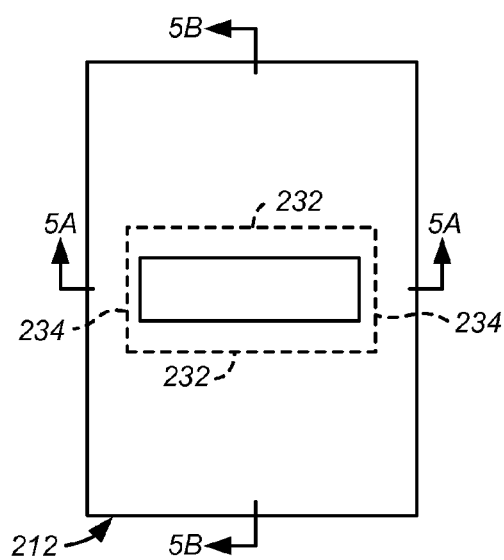
Figure 5B:
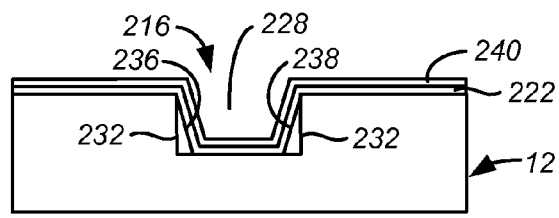
Figure 5A:
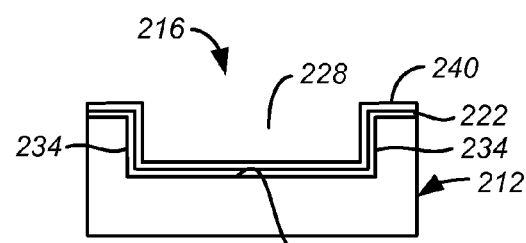

FIGS. 5-5B shows the structure of FIGS. 4-4B after the conformal deposition of an insulating layer 222 followed by the conformal deposition of a relatively thick layer of conductive material 240. In one example, insulating layer 222 is an oxide, such as silicon dioxide; other materials, such as SiN, SiON and $Al_2O_3$, can also be used. The insulating material may also be a multi-layer, such as silicon oxide/silicon nitride/silicon oxide (ONO), silicon oxide/high-k dielectric/silicon oxide (O/high-k/O). In this example, conductive material 240 is doped polysilicon (using dopants such as As, P), but, for example, materials such as a metal or combination of metals, including Al, Cu, W, Ti, Co, Ni, can also be used. The conductive material 240 can also be metal compounds, such as TiN/TaN/AlCu, or semiconductor compounds, such as heavily doped silicides including TiSi, CoSi. The dashed line in FIG. 5 indicates the location of the sides 232, 234 of FIG. 3.

Figure 6:
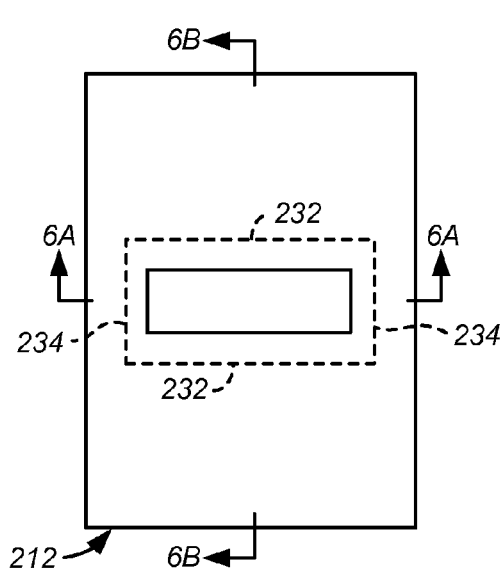
Figure 6B:
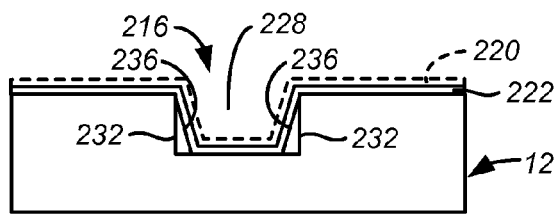
Figure 6A:
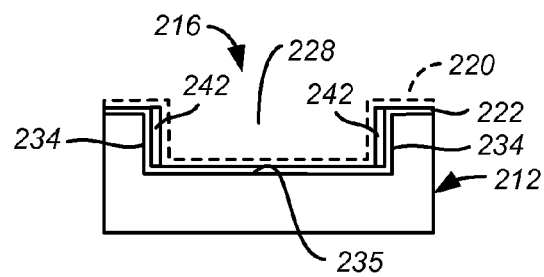

FIGS. 6-6B illustrate the structure of FIGS. 5-5B after an anisotropic etch of the conductive material 240. Doing so removes the portion of conductive material 240 from the horizontal surfaces above bottom 235 within recess 228 and over the upper surfaces 230 of array areas 214. Sloped first sides 232 are sloped with angle 233 being sufficiently large to ensure that conductive material 240 is also removed from the sloped first sides 232 during the anisotropic etch. Angle 233 depends largely on the particular material used for tapered spacers 236 and the anisotropic etch used. However, the anisotropic, that is directional, characteristic of the anisotropic etch, results in formation of sidewall spacers on the upward extensions of the active layers, providing generally vertically extending conductive strips 242 of conductive material 240 along second sides 234. Conductive material 240 is completely removed from the sloped first sides 232 as shown in FIG. 6A, while in FIG. 6B conductive strips 242 are shown at second sides 234. This is followed by the conformal deposition of an active layer 220, shown in dashed lines, which conforms to the contour of insulating layer 222 and conductive strips 242. Active layer 220 is a semiconductive or conductive material, such as polysilicon, but other materials such as discussed above with regard to conductive material 240 can also be used. An alternative order can be used for the deposition of the active and insulating layers 220, 222. In addition, conductive strips 242 could be created by other than depositing conductive material 240 on all of the surfaces defining recess 228. For example, conductive strips 242 could be created by patterned etching rather than sidewall spacer processes, or by other technologies.

Figure 7:
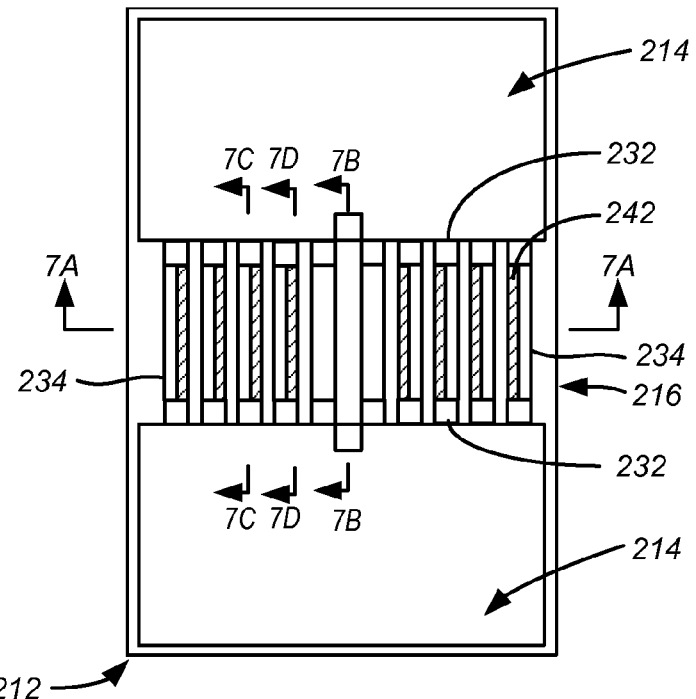
Figure 7A:
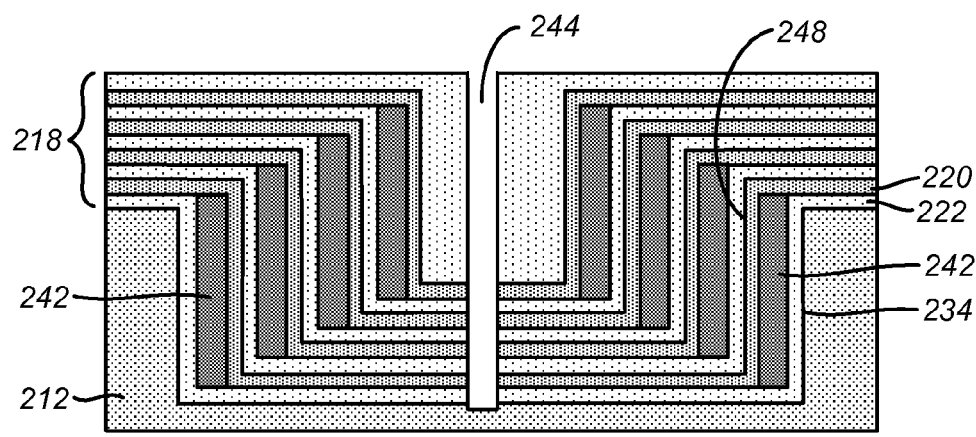
Figure 7B:
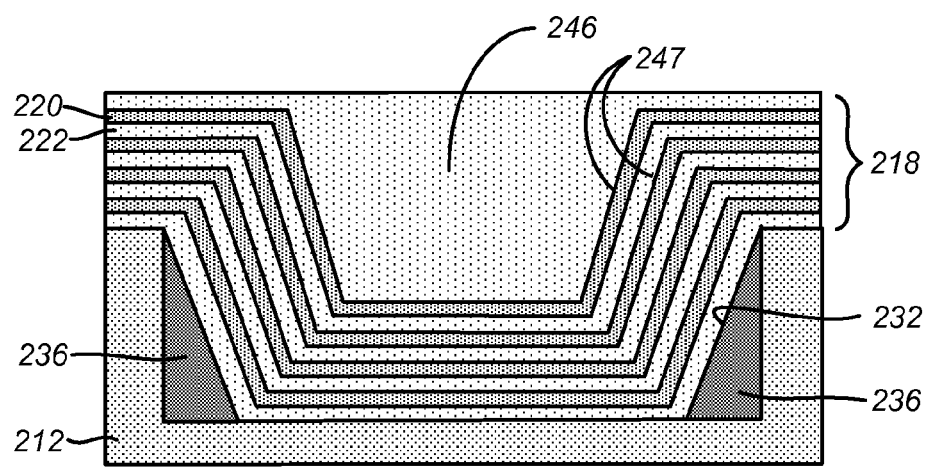
Figure 7C:
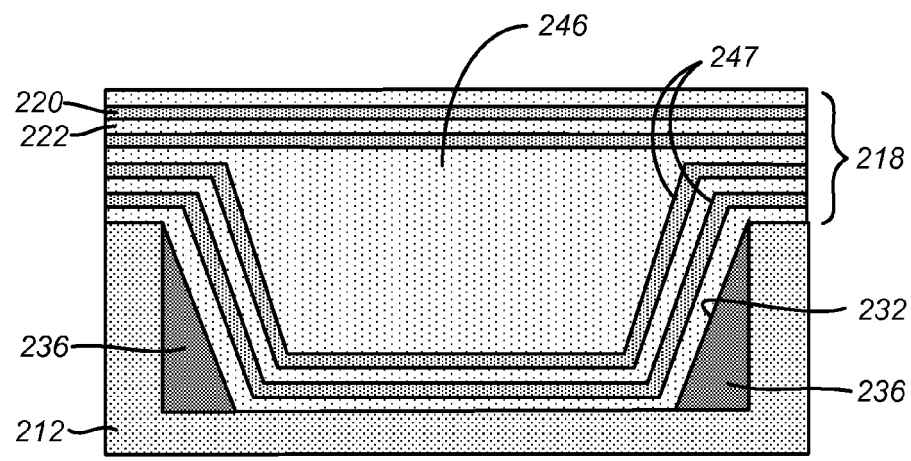
Figure 7D:
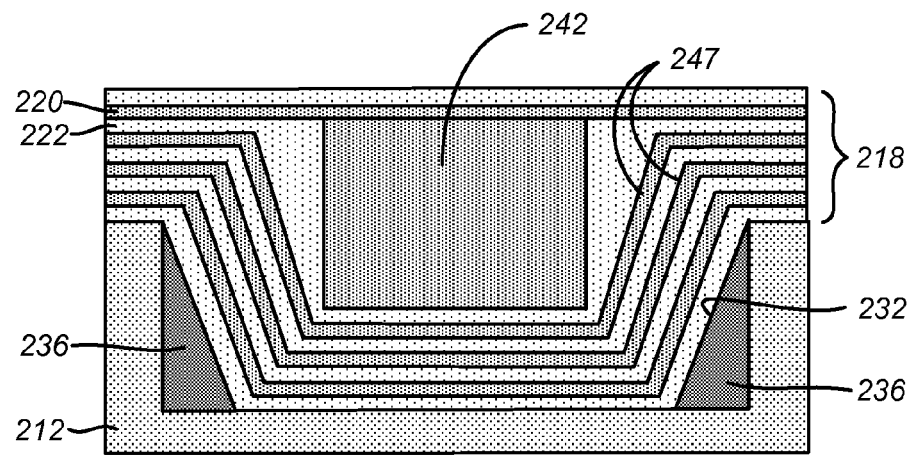

FIGS. 7-7D show the structure of FIG. 6 following the repeat of the deposition and etching steps of FIGS. 5-6B to create a stack 218 of alternating active and insulating layers 220 and 222 overlying the array areas 214 and the contact area 216. FIGS. 7A-7D are enlarged cross-sectional views relative to FIG. 7. Stack 218 of layers 220, 222 extends conformally over upper surface 230 of array areas 214 and also conformally over recessed contact area 216, that is over the bottom 235, sloped first sides 232 and second sides 234. FIGS. 7-7A indicate that stack 218 of alternating active and insulating layers 220, 222 within the recess 228 have been cut so that a gap 244 separates the stacks into left and right sides. Separating the active and insulating layers 220, 222 within recess 228 allows using two second sides 234 for different blocks of cells as illustrated by block 251 in FIG. 8. Stack 218 includes first and second upward extensions 247, 248 of active layers 220 within recess 228 along first sides 232 and second sides 234, respectively. Creation of stack 218 is then followed by covering the structure with an insulating material, such as silicon oxide.

Figure 8:
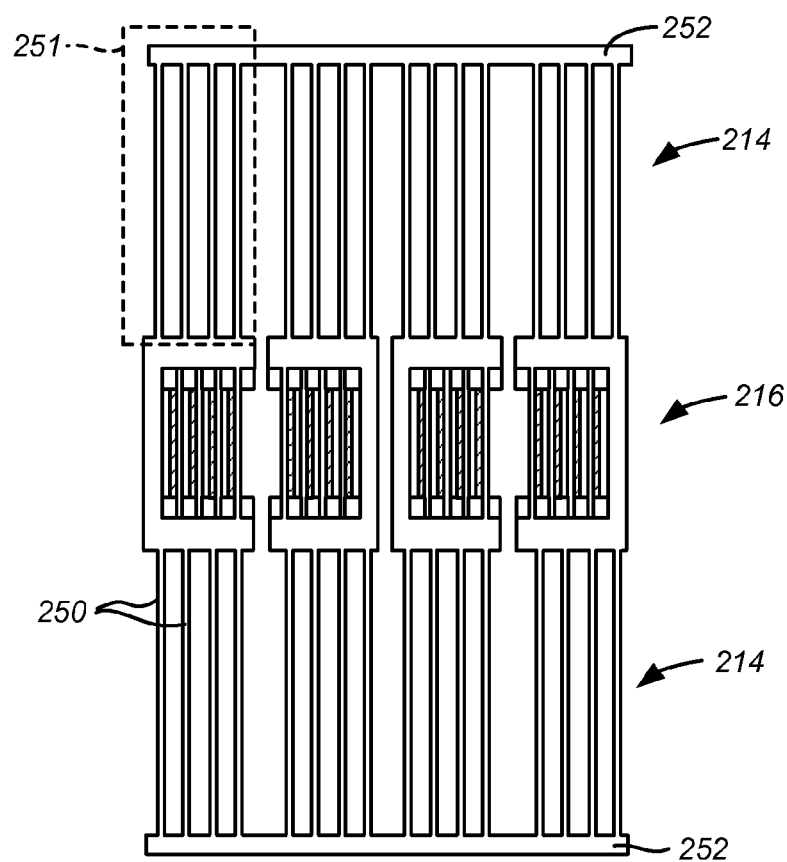

FIG. 8 is a simplified top plan view of two side-by-side structures of FIG. 7 following etching of stack 218 of active and insulating layers 220, 222 to create layers of local bit lines 250 and source lines 252 in array areas 214. In some examples, the entire stack 218 is etched at the same time. The same etch pattern may or may not be used for each block 251 of local bit lines 250. The processing steps typically do not affect contact area 216. In some examples, source lines 252 can correspond to source line 128 in FIG. 1. Bit lines 250 are local bit lines within the active layers. As is discussed in more detail below, interlayer conductors 224 are used to connect the layers of local bit lines 250 to global bit lines (not shown), such as the global bit lines shown as the topmost elements extending generally from the upper left towards the lower right in FIG. 1.

Figure 9:
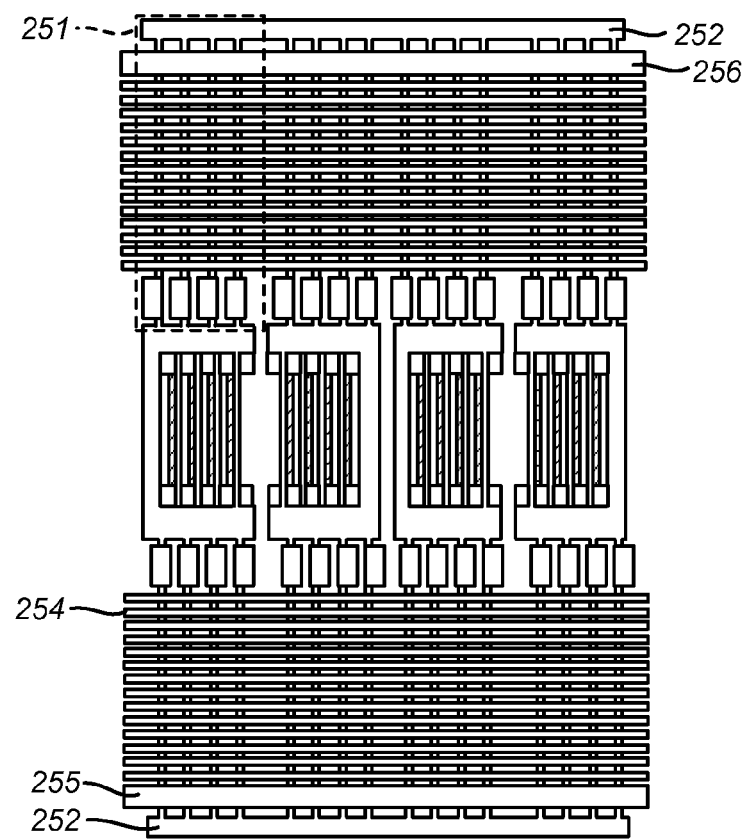

FIG. 9 shows an aerial view of the structure of FIG. 8 after creating word lines 254 within array areas 214. Word lines 254 correspond to word lines 125-1 through 125-N in FIG. 1. Also created are a gate select line 255 at one end and a string select line 256 at the opposite end. Ground select line 255 corresponds to ground select lines 126, 127 of FIG. 1 and is used to connect source line 252 to local bit lines 250. String select line 256 corresponds to string select lines 1064 in FIG. 16. In this example, active layers 220 are used to form local bit lines. In other examples, active layers 220 can be used to create source lines instead of bit lines.

Figure 10:
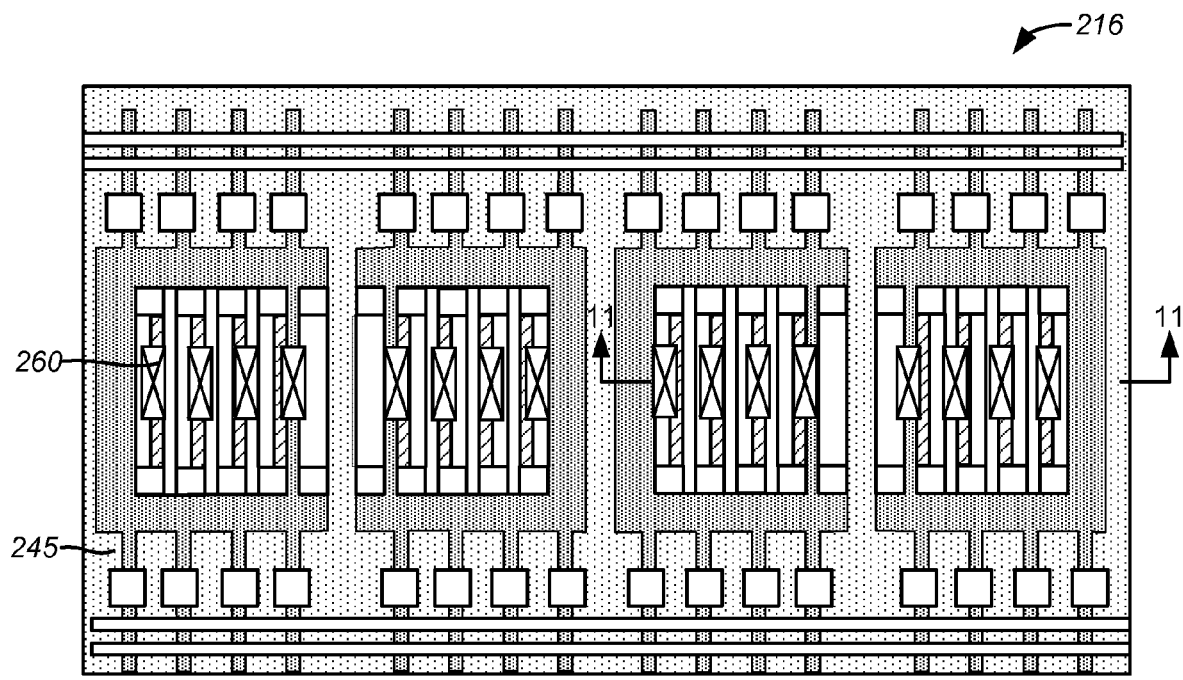

After formation of the structure of FIG. 9, an interlayer dielectric fill 245, see FIG. 10, is formed over array areas 214 and contact area 216. Interlayer dielectric 245 can be an insulator such as silicon oxide or as discussed above with reference to insulating layer 222. As discussed below, contact vias can be formed in the interlayer dielectric 245 to expose the landing areas 226 created by first upward extensions 247 and their adjacent conductive strips 242. The vias can be filled with interlayer conductors. As discussed above, array area structures including global bit lines, string select lines and the like can be formed over the interlayer dielectric and make contact to the interlayer conductors.

Figure 11:
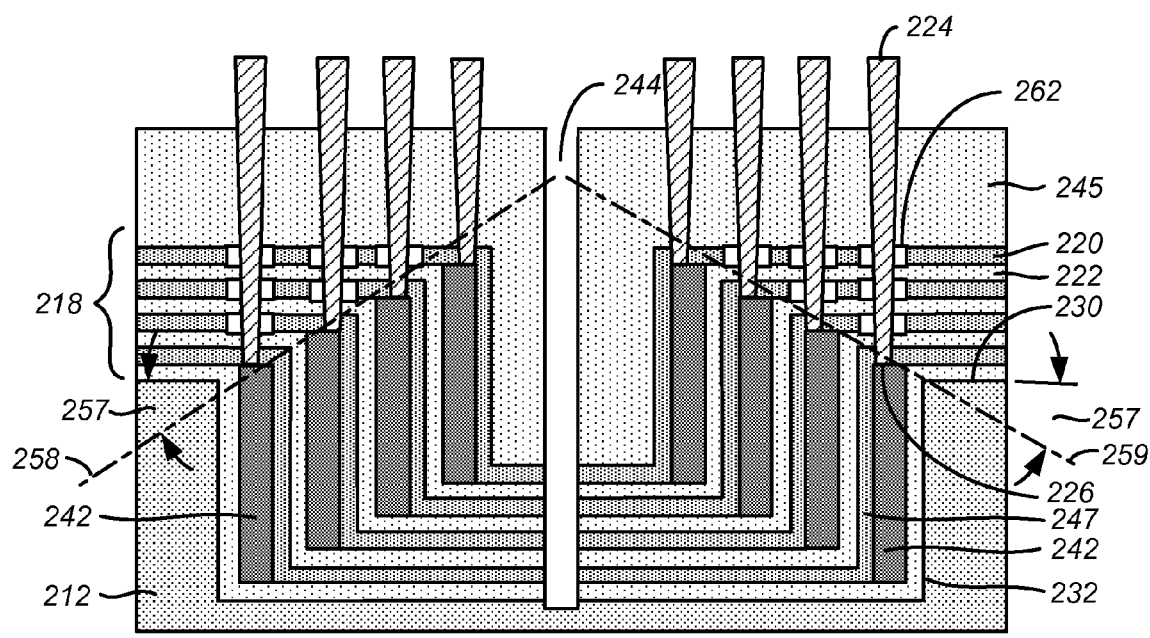

FIG. 10 is an enlarged aerial or layout view of a portion of the structure of FIG. 9 including contact area 216. FIG. 10 shows the plan view locations 260 for the interlayer conductors 224 shown in FIG. 11. FIG. 11 is a cross-sectional view of a portion of the structure of FIG. 10 showing landing areas 226 created by conductive strips 242 and adjacent upward extensions 247 of active layer 220. The vertical conductive strips 242 have lower sides in the recess contacting respective active layers of the stack at different depths in the recess, and have upper sides that lie nominally along the planes 258, 259, where "nominally" means that they are lie in the plane within limitations of manufacturing processes and within manufacturing variations. The conductive strips are configured to connect, or provide contact landing areas for connection of, corresponding active layers at different depths in the recess to overlying conductors through interlayer conductors 224. Insulating spacers 262 are formed in active layers 220 at positions overlying landing areas 226. One way to do so is to form a via for each interlayer conductor 224 so that it passes through interlayer dielectric 245 and through the active layers 220 overlying the landing area 226 for that interlayer conductor. This can be followed by oxidizing the surfaces of active layers 220 opening onto the vias to create the insulating spacers 262 from the oxidized material of the active layers. As shown in FIG. 11, the interlayer conductors in contact with the conductive strips, the interlayer conductors have a nominal width, where "nominal" means that have the named width within limitations of manufacturing processes and within manufacturing variations. Though not illustrated in this drawing, the active layers can be much thinner than that nominal width. The conductive strips however, can have a pitch (distance from the center of one conductive strip to the center of its adjacent conductive strip) at their upper sides that is at least as large as, or larger than, the nominal width of the interlayer conductors. This provides significant alignment margin, simplifying the manufacturing of the structures, even for active layers that can be on the order of ten or twenty nanometers (or less) thick, which can be considered a critical thickness at which making contact using a vertical via to an individual active layer can be very difficult to achieve with reasonable reliability.

Alternatively, the vias can be lined with an insulating layer to create the insulating spacers 262. Conductive material is then deposited within the vias to pass through interlayer dielectric 245, through the openings in insulating spacers 262, and down to landing areas 226 to create interlayer conductors 224. Therefore, interlayer conductors 224 extend through the interlayer dielectric 245, through overlying active layers 220 and down to landing areas 226. In this way, interlayer conductors 224 contact associated landing areas 226 but are electrically isolated from overlying active layers 220. Interlayer conductors 224 connect the landing areas 226 for the local bit lines 250 to the global bit lines (not shown) in an embodiment in which the active layers 220 are used to form local bit lines. In this example, landing areas 226 within contact area 216 extend along two different planes 258, 259, each at an acute angle 257 to upper surface 230. Therefore, in this example the upper ends of conductive strips 242 are at different levels relative to upper surface 230.

FIGS. 12-15 illustrate an alternative to the example shown in FIGS. 10-11 as to how interlayer conductors 224 are connected to landing areas 226.

Figure 12:
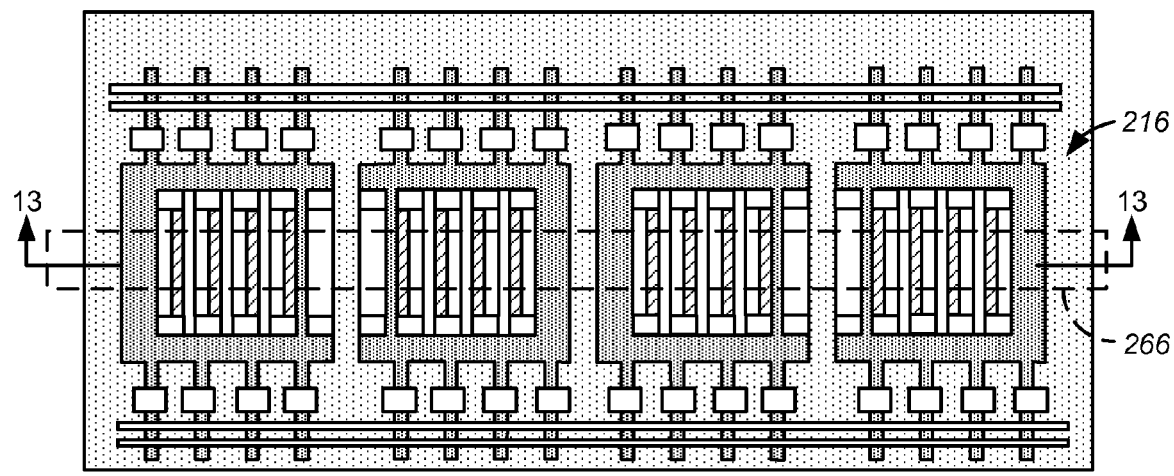
Figure 13:
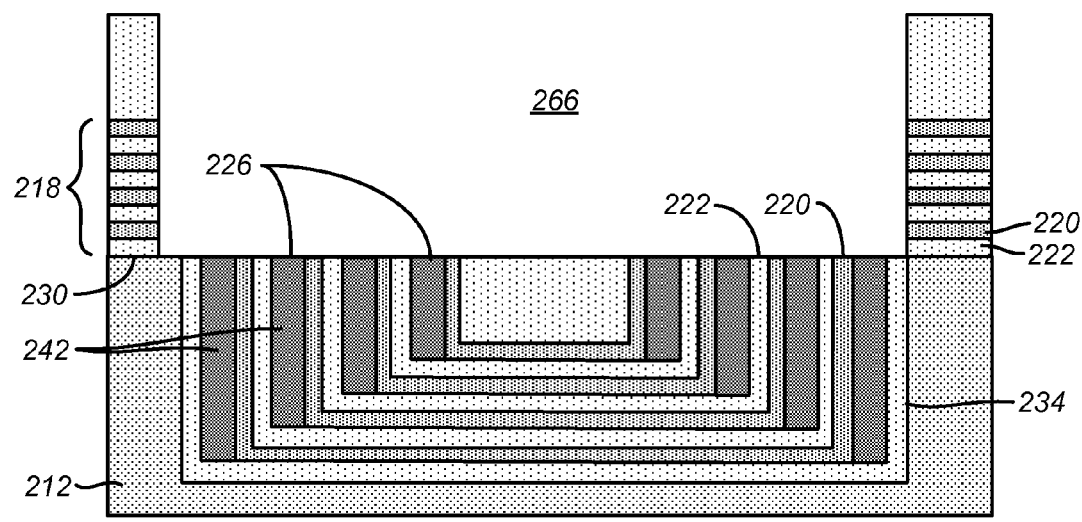

FIG. 12 is an enlarged view of the central portion of the structure of FIG. 9 illustrating contact area 216 but outlining a region 266 to be etched in dashed lines. FIG. 13 is a cross-sectional view taken along line 13-13 of FIG. 12 after etching region 266. After etching region 266, all of the landing areas 226 extend along a single plane oriented generally parallel to upper surface 230. So, in this example, the vertical conductive strips 242 have lower sides in the recess contacting respective active layers of the stack at different depths in the recess, and have upper sides that lie nominally in a single plane. The conductive strips are configured to connect, or provide contact landing areas for connection of, corresponding active layers at different depths in the recess to overlying conductors through interlayer conductors 224.

Figure 14:
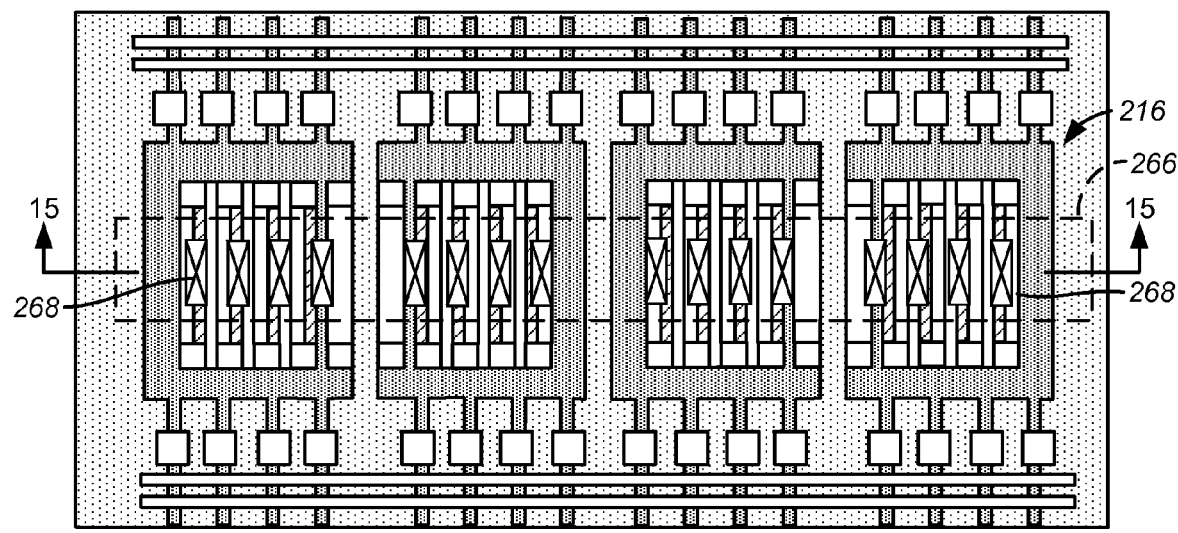
Figure 15:
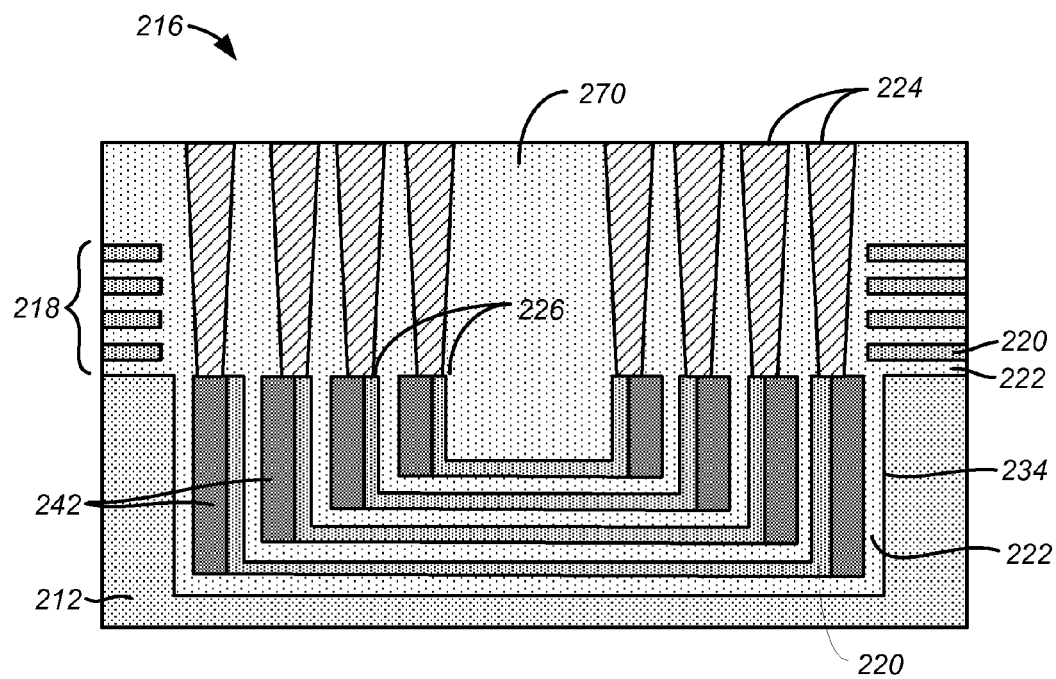

FIG. 14 shows the structure of FIG. 13 but indicates at locations 268 where the interlayer conductors 224 will be created. FIG. 15 shows the structure of FIGS. 13 and 14 after depositing an insulating material 270 within the etched out region 266 of FIG. 13. The upper ends of conductive strips 242 provide contact landing areas 226 for connection of overlying interlayer conductors 224 to corresponding active layers 220. The contact landing areas 226 are at the same level relative to upper surface 230 of substrate 212, and thus are parallel to the upper surface 230. An example of insulating material 270 is silicon dioxide but other insulating materials as discussed above with regard to insulating layer 222 can also be used. Openings are then formed through insulating material 270 followed by forming interlayer conductors 224 through insulating material 270 down to landing areas 226. Although the procedure described in FIGS. 12-15 requires an additional mask to create region 266, as compared to the procedure described with regard to FIGS. 10 and 11, the isolation between the contact at landing areas 226 and the unselected insulating layers 222 can be greater with the procedure of FIGS. 12-15

Figure 16:
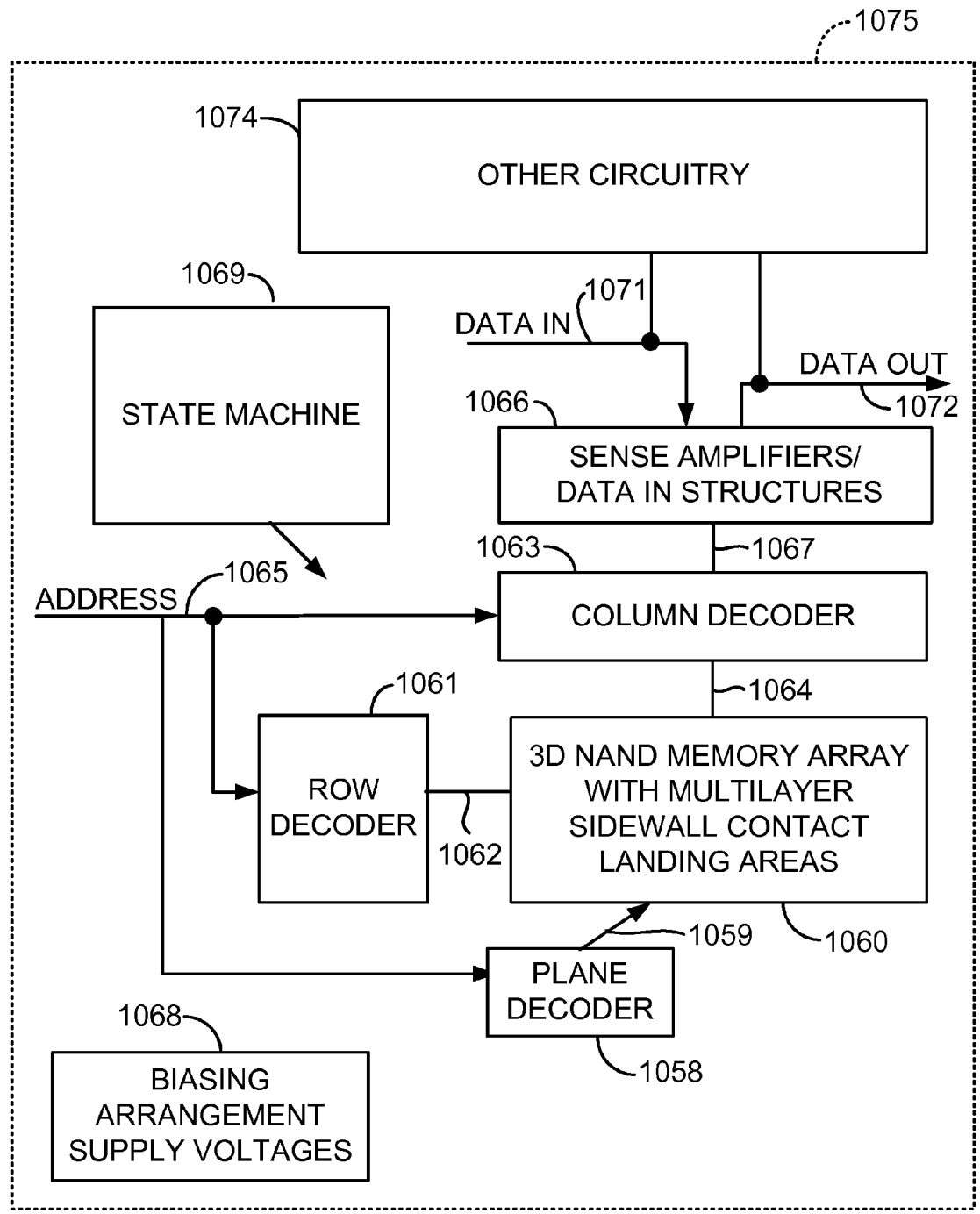
FIG. 16 is a schematic diagram of an integrated circuit including a 3D NAND memory array.

FIG. 16 is a schematic diagram of an integrated circuit including a 3D NAND memory array. The integrated circuit 1075 includes a 3D NAND flash memory array on a semiconductor substrate 212. Substrate 212 includes an array area 214 and a recessed contact area 216 with a stack 218 of alternating active layers 220 and insulating layers 222 at both the array area 214 and recessed contact area 216. A row decoder 1061 is coupled to a plurality of word lines 1062, and arranged along rows in the memory array 1060. A column decoder 1063 is coupled to a plurality of SSL lines 1064, including string select structures, arranged along columns corresponding to stacks in the memory array 1060 for reading and programming data from the memory cells in the array 1060. A plane decoder 1058 is coupled to a plurality of planes in the memory array 1060 via bit lines 1059. Addresses are supplied on bus 1065 to column decoder 1063, row decoder 1061 and plane decoder 1058. Sense amplifiers and data-in structures in block 1066 are coupled to the column decoder 1063 in this example via data bus 1067. Data is supplied via the data-in line 1071 from input/output ports on the integrated circuit 1075 or from other data sources internal or external to the integrated circuit 1075, to the data-in structures in block 1066. In the illustrated embodiment, other circuitry 1074 is included on the integrated circuit, such as a general purpose processor or special purpose application circuitry, or a combination of modules providing system-on-a-chip functionality supported by the NAND flash memory cell array. Data is supplied via the data-out line 1072 from the sense amplifiers in block 1066 to input/output ports on the integrated circuit 1075, or to other data destinations internal or external to the integrated circuit 1075.

A controller implemented in this example using bias arrangement state machine 1069 controls the application of bias arrangement supply voltage generated or provided through the voltage supply or supplies in block 1068, such as read, erase, program, erase verify and program verify voltages.

The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The above descriptions may have used terms such as above, below, top, bottom, over, under, et cetera. These terms may be used in the description and claims to aid understanding of the invention and not used in a limiting sense. Any and all patent applications and printed publications referred to above are incorporated by reference.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

What is claimed is:

1. A device comprising:
 a substrate comprising an upper surface and a recess extending into the substrate from the upper surface;
 the recess having a bottom and sides extending between the upper surface and the bottom, the sides comprising first and second sides oriented transversely to one another;
 a stack of alternating active and insulating layers overlying the recess;
 each of a plurality of said active layers having a lower portion extending along a lower plane over and generally parallel to the bottom;
 each of the plurality of said active layers comprising first and second upward extensions positioned along the first and second sides and extending from the lower portions of their respective active layers;
 the second upward extensions having lengths with lower ends towards the bottom and upper ends; and
 a plurality of conductive strips adjoining the second upward extensions of the plurality of said active layers along their lengths towards but not past their upper ends.

2. The device of claim 1, wherein:
 the stack of alternating active and insulating layers also overlies the upper surface of the substrate and the recess; and
 each of the plurality of active layers also has an upper portion extending along in a plane over and generally parallel to the upper surface.

3. The device of claim 2, wherein the first upward extensions connect the upper and lower portions of their respective active layers.

4. The device of claim 2, wherein:
the upper surface comprises an array area adjacent to the recess; and
the stack of alternating active and insulating layers comprises elements of a memory array at the array area.

5. The device of claim 1, wherein the second upward extensions are oriented generally perpendicular to the upper surface and the first upward extensions are downwardly and inwardly sloped at an acute angle to the upper surface.

6. The device of claim 1, wherein:
the recess is a generally rectangular recess with a third side opposite the first side and a fourth side opposite the second side; and
the second and fourth sides are oriented generally perpendicular to the upper surface and the first and third side are downwardly and inwardly sloped oriented at acute angles to the upper surface.

7. The device of claim 1, wherein the upper surface and the bottom are generally parallel to one another.

8. A device comprising:
a substrate comprising an upper surface and a recess extending into the substrate from the upper surface;
the recess having a bottom and sides extending between the upper surface and the bottom, the sides comprising first and second sides oriented transversely to one another;
a stack of alternating active and insulating layers overlying the recess;
each of a plurality of said active layers having a lower portion extending along a lower plane over and generally parallel to the bottom;
each of the plurality of said active layers comprising first and second upward extensions positioned along the first and second sides and extending from the lower portions of their respective active layers; and
a plurality of conductive strips adjoining the second upward extensions of the plurality of said active layers, the plurality of conductive strips comprising sidewall spacers on sides of the second upward extensions.

9. A device comprising:
a substrate comprising an upper surface and a recess extending into the substrate from the upper surface;
the recess having a bottom and sides extending between the upper surface and the bottom, the sides comprising first and second sides oriented transversely to one another;
a stack of alternating active and insulating layers overlying the recess;
each of a plurality of said active layers having a lower portion extending along a lower plane over and generally parallel to the bottom;
each of the plurality of said active layers comprising first and second upward extensions positioned along the first and second sides and extending from the lower portions of their respective active layers; and
a plurality of conductive strips adjoining the second upward extensions of the plurality of said active layers, the conductive strips having lower and upper ends, the lower ends being in the recess, the upper ends being configured to connect to overlying conductors by interlayer conductors.

10. The device of claim 9, wherein the upper ends of at least some of the conductive strips are at the same level, the same level being parallel to the upper surface.

11. The device of claim 9, wherein the upper ends are at different levels relative to the upper surface.

12. The device of claim 9, wherein the upper ends of the conductive strips provide landing areas for the interlayer conductors.

13. The device of claim 9, wherein the upper ends of the conductive strips and adjacent ones of the second upward extensions provide landing areas for the interlayer conductors.

14. A method for forming electrical connections with active layers of a stack of alternating active and insulating layers of a device, the method comprising:
forming a recess in a substrate, the substrate comprising an upper surface with the recess extending into the substrate from the upper surface, the recess having a bottom and sides extending between the upper surface and the bottom, the sides comprising first and second sides oriented transversely to one another;
forming a stack of alternating active and insulating layers over the recess;
the stack forming step comprising:
forming a lower portion of each of the plurality of active layers to be along a lower plane and over and generally parallel to the bottom; and
forming first and second upward extensions of each of the plurality of active layers to be positioned along the first and second sides and to extend from the lower portions of their respective active layers; and
during the stack forming step, forming conductive strips adjoining the second upward extensions of the plurality of active layers.

15. The method of claim 14, wherein the stack forming step also forms: (a) the said stack of alternating active and insulating layers over the upper surface of the substrate; and (b) an upper portion of each of a plurality of the active layers to be along and a plane and over and generally parallel to the upper surface.

16. The method of claim 14, wherein the recess forming step comprises forming the first side as a downwardly and inwardly sloped first side oriented at an acute angle to the upper surface.

17. The method of claim 16, wherein:
the recess forming step comprises forming the second side oriented generally perpendicular to the upper surface;
the conductive strips forming step comprising depositing a layer of conductive material along the bottom and sides of the recess, and anisotropically etching the conductive material; and
selecting the acute angle of the sloped first side so that the conductive material is removed from along the bottom and the first side during the anisotropically etching of the conductive material while leaving conductive material along the second side thereby forming a conductive strip.

18. The method of claim 16, wherein:
the recess forming step comprises forming a generally rectangular recess having first, second, third and fourth sides with the first and third sides being opposite one another and being downwardly and inwardly sloped sides oriented at acute angles to the upper surface; and
the conductive strips forming step comprises forming the conductive strips as sidewall spacers at the second and fourth sides but not at the first or third sides.

19. The method of claim 14, wherein:
the conductive strips forming step comprises forming the conductive strips as sidewall spacers on sides of the second upward extensions but not on sides of the first upward extensions.

20. The method of claim 14, further comprising forming interlayer conductors contacting upper surfaces of the conductive strips, the upper surfaces defining landing areas for the interlayer conductors.

21. The method of claim 20, wherein the landing areas extend along a landing area plane generally parallel to the upper surface or at an acute angle to the upper surface.

22. The method of claim 14, further comprising forming interlayer conductors contacting landing areas created by upper ends of the conductive strips and adjacent ones of the second upward extensions.

* * * * *